United States Patent
Nguyen Hoang et al.

(10) Patent No.: US 7,491,639 B2
(45) Date of Patent: Feb. 17, 2009

(54) METHOD OF MANUFACTURING A SEMICONDUCTOR DEVICE AND SEMICONDUCTOR OBTAINED BY MEANS OF SUCH A METHOD

(75) Inventors: Viet Nguyen Hoang, Leuven (BE); Dirk Jan Gravesteijn, Leuven (BE); Romano Julma Oscar Maria Hoofman, Leuven (BE)

(73) Assignee: NXP, B.V., Eindhoven (NL)

( * ) Notice: Subject to any disclaimer, the term of this patent is extended or adjusted under 35 U.S.C. 154(b) by 394 days.

(21) Appl. No.: 10/539,280

(22) PCT Filed: Dec. 15, 2003

(86) PCT No.: PCT/IB03/06071
§ 371 (c)(1),
(2), (4) Date: Jun. 15, 2005

(87) PCT Pub. No.: WO2004/057664
PCT Pub. Date: Jul. 8, 2004

(65) Prior Publication Data
US 2006/0128089 A1    Jun. 15, 2006

(30) Foreign Application Priority Data
Dec. 20, 2002 (EP) .................... 02080507

(51) Int. Cl.
*H01L 21/4763* (2006.01)
(52) U.S. Cl. ............... 438/637; 438/618; 438/689; 438/E21.579; 438/E21.589
(58) Field of Classification Search ........ 257/E21.579; 438/618, 637
See application file for complete search history.

(56) References Cited

U.S. PATENT DOCUMENTS

| 6,033,977 A * | 3/2000 | Gutsche et al. ........... 438/618 |
| 2005/0042874 A1* | 2/2005 | Meagley et al. ........... 438/689 |

OTHER PUBLICATIONS

Patent Abstracts of Japan vol. 2003, No. 11, Nov. 5, 2003.

* cited by examiner

*Primary Examiner*—Dao H. Nguyen

(57) ABSTRACT

The invention relates to the manufacture of a semiconductor device (10) with a semiconductor body (1) and a substrate (2) and comprising at least one semiconductor element (3), which semiconductor device is equipped with at least one connection region (4) and a superjacent strip-shaped connection conductor (5) which is connected to the connection region, which connection region and connection conductor are both recessed in a dielectric, and a dielectric region (6) of a first material is provided on the semiconductor body (1) at the location of the connection region (4) to be formed, after which the dielectric region (6) is coated with a dielectric layer (7) of a second material that differs from the first material, which dielectric layer is provided, at the location of the strip-shaped connection conductor (5) to be formed, with a strip-shaped recess (7A) which overlaps the dielectric region (6) and extends up to said dielectric region, and after the formation of the recess (7A) and the removal of the dielectric region (6), connection region (4) is formed by depositing an electroconductive material in the space (6A) created by the removal of the dielectric region (6), and the connection conductor (5) is formed by depositing an electroconductive material in the recess (7A). According to the invention, for the first material use is made of an organic material, and for the second material use is made of a material having a higher decomposition temperature than the organic material, and the dielectric region (6) is removed by heating it at a temperature above the decomposition temperature of the organic material yet below the decomposition temperature of the second material. A method according to the invention is very simple and, due to an optimal choice for the second material, may result in a high planarity of the device (10) obtained. For the dielectric region (4), use is preferably made of a photoresist, and for the dielectric layer (7), use is preferably made of a liquid material such as a SILK or SOG material which is converted to the solid state by heating.

10 Claims, 2 Drawing Sheets

Figure 1:
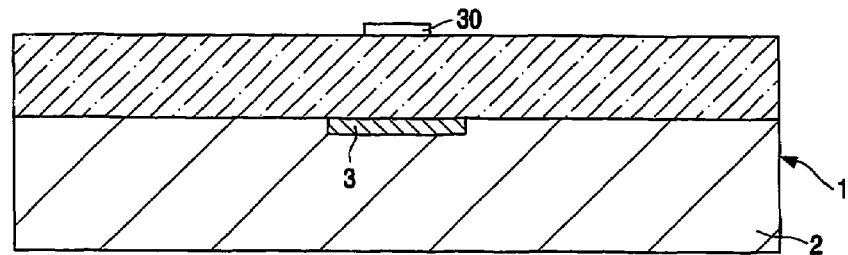

METHOD OF MANUFACTURING A SEMICONDUCTOR DEVICE AND SEMICONDUCTOR OBTAINED BY MEANS OF SUCH A METHOD

The invention relates to a method of manufacturing a semiconductor device with a semiconductor body and a substrate and comprising at least one semiconductor element, which semiconductor device is equipped with at least one connection region and a superjacent strip-shaped connection conductor which is connected to the connection region, which connection region and connection conductor are both recessed in a dielectric, and a dielectric region of a first material is provided on the semiconductor body at the location of the connection region to be formed, after which the dielectric region is coated with a dielectric layer of a second material that differs from the first material, which dielectric layer is provided, at the location of the strip-shaped connection conductor to be formed, with a strip-shaped recess which, viewed in projection, overlaps the dielectric region and extends up to said region, and after the formation of the recess and the removal of the dielectric region, the connection region is formed by depositing an electroconductive material in the space obtained by the removal of the dielectric region, and the connection conductor is formed by depositing an electroconductive material in the recess. Such a method can particularly suitably be used to manufacture more complex semiconductor devices wherein use is made of a so-termed multilevel or multilayer technique. In accordance with said technique, a connection region, also referred to as via, and a strip-shaped connection conductor situated above and connected to said connection region, also referred to as trench, are formed, which are both recessed in a dielectric.

Such a method is known from United States patent specification U.S. Pat. No. 6,033,977, published on 7 Mar. 2000. In said document a description is given of how a semiconductor body equipped with a substrate is provided with a dielectric region of a first material, at the location of the connection region to be formed, and how a dielectric layer of a second material, different from the first material, is deposited thereon, a recess being formed in said dielectric layer, at the location of the strip-shaped conductor, and extending as far as the dielectric region and overlapping said region. After the formation of the recess by means of photolithography and etching, the dielectric region is removed by means of etching. Next, the connection region and the connection conductor are formed by providing a conductor in the open space where the dielectric region was previously situated and in the recess.

A drawback of the known method resides in that it is comparatively complex because it comprises many steps. In addition, the planarity of the device obtained sometimes leaves to be desired. As the method is generally concluded by a CMP (=Chemical Mechanical Polishing) process and/or further photolithographic and etch steps, and because the smallest details of the device to be manufactured are getting smaller and smaller, it is very important that the device with the connection region and the strip-shaped connection conductor is as planar as possible.

Therefore, it is an object of the invention to provide a method of the type mentioned in the opening paragraph, which is less complex and results in a device which is as planar as possible.

To achieve this, a method of the type mentioned in the opening paragraph is characterized in accordance with the invention in that for the first material use is made of an organic material, and for the second material use is made of a material having a higher decomposition temperature than the organic material, and the dielectric region is removed by heating it at a temperature above the decomposition temperature of the organic material yet below the decomposition temperature of the second material. The invention is primarily based on the recognition that the choice of an organic material for the dielectric region enables this region to be removed by means of heating. This is a simpler process step than an etch process. In addition, in certain variants, this process step can be combined with another heating step, that is necessary in itself anyhow, as a result of which effectively one process step can be saved. The invention is further based on the recognition that these advantages can be achieved, in particular, if the material of the dielectric layer is a liquid material which, after it has been deposited, is converted to a solid material in a subsequent heating step. Finally, the invention is based on the recognition that the use of a material for the dielectric layer that is applied in the liquid state results in a particularly planar structure.

In a first embodiment of a method in accordance with the invention, a photoresist is used as the first material, and a dielectric resin having a higher decomposition temperature than the photoresist is used as the second material.

Such dielectric resins usually are liquids that are applied to the device by means of a so-termed spinning process. Alternatively, a photoresist can be used as the dielectric resin, in which case also the formation of the recess is simplified. A suitable resin is a porous resin such as marketed under the trade name SILK by Dow Chemical Company. Such a material may have a high thermal stability of, for example, above 450 degrees Celsius. Ordinary photoresists that may be used for the dielectric region generally have a much lower thermal stability of, for example, 200 to 300 degrees Celsius. As a result, the material of the dielectric region can be decomposed and gasified, while the material of the dielectric layer still remains stable. The gases formed as a result of decomposition of the dielectric region can escape through the dielectric layer.

It is not necessary, however, that the dielectric region is gasified before the recess is formed in the dielectric layer. If the dielectric region is gasified after the recess has been formed, the gases can be discharged even more readily.

In a further embodiment, a photoresist is used as the first material, and a liquid glass is used as the second material, which liquid gas is converted to solid glass by heating. Such a material has a very high decomposition temperature, and in order to be converted to a solid glass it must already undergo a thermal treatment at a temperature which is so high that most organic materials decompose and are gasified. Thus, in this case a suitable choice of the material of the dielectric region enables in fact that an entire process step, i.e. the etching of the dielectric region, can be dispensed with as compared to the known method, without any additional step being required. A suitable glass is a silicate glass or a phosphor silicate glass, such as those marketed under the trade names ACCUSPIN or ACCUGLASS by Honeywell Electronic Materials.

From the above it follows that the dielectric region in this variant is preferably removed during a thermal treatment of the semiconductor body wherein the liquid glass is converted to solid glass. In this case, an entire (etching) process step is saved. From the above it also follows that the first material as well as the second material are applied in liquid state to the semiconductor body by means of a spinning/centrifuging process. By virtue thereof, if the first material is a photoresist, the dielectric region can be readily formed. Also the planarity of the device obtained is increased and hence improved.

In a favorable modification, the dielectric region is formed by applying a further dielectric layer above which a mask is provided outside which the further dielectric layer is removed by means of etching, and the dielectric layer, after deposition, is covered with a mask which is provided with an aperture at the location of the recess to be formed, after which the recess is formed by means of etching. The further dielectric layer is preferably a photoresist, and the etching process consists of a developing step.

Preferably, after removal of the dielectric region and after formation of the recess, yet before deposition of the conductive material, the semiconductor body is cleaned. As a result, any solid organic residues of the gasified dielectric region are now removed. It has been found that such a cleaning operation can be suitably carried out by means of an oxygen plasma.

In a further modification, copper is used as the electroconductive material, and prior to the deposition of the copper, an electroconductive layer is deposited at the location of the connection region to be formed, which electroconductive layer forms a barrier for copper. By virtue of its excellent electrical and thermal conduction properties, copper is a particularly suitable material for a via and a trench. By separating the copper from the rest of the semiconductor body by means of a copper barrier, contamination of the semiconductor body by copper is precluded. A suitable, electroconductive material for the barrier is TaN (tantalum nitride). Preferably, the electroconductive layer is applied by means of a physical vapor deposition process, and the copper is provided by means of an electroplating process.

The invention also comprises a semiconductor device obtained by means of a method in accordance with the invention. Such a device may comprise an integrated circuit whose smallest dimensions can be very small.

These and other aspects of the invention are apparent from and will be elucidated with reference to the embodiment(s) described hereinafter.

Figure 2:
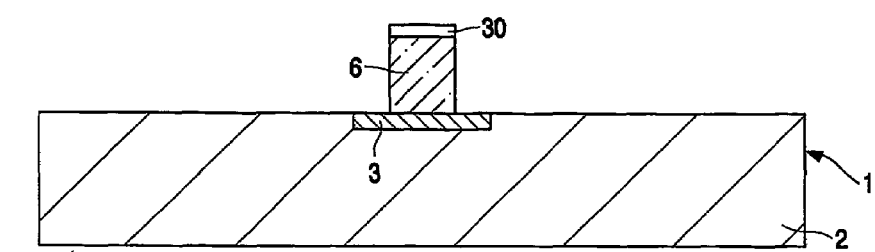
Figure 3:
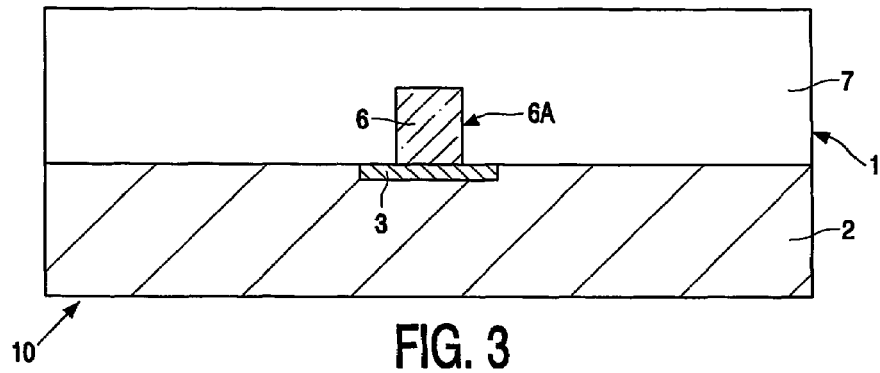
Figure 4:
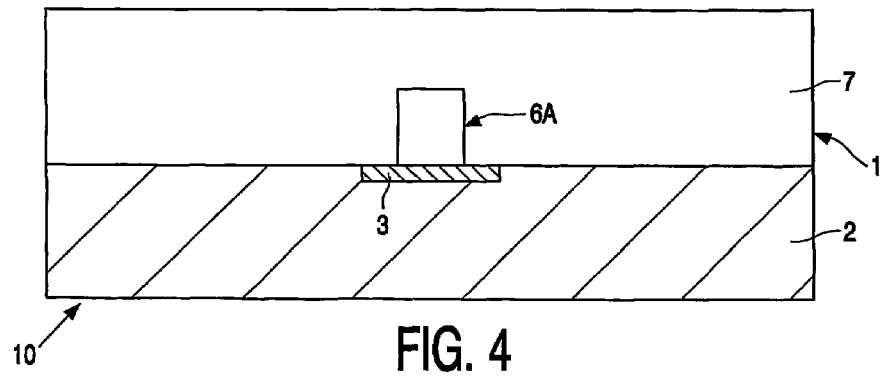
Figure 5:
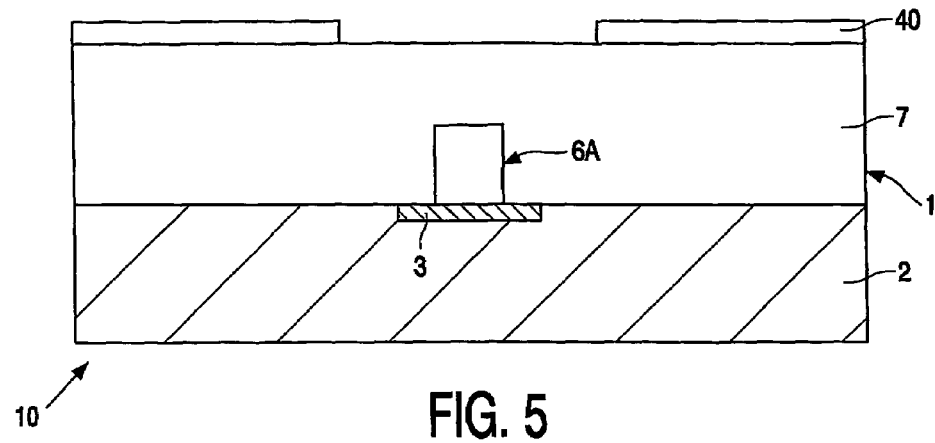
Figure 6:
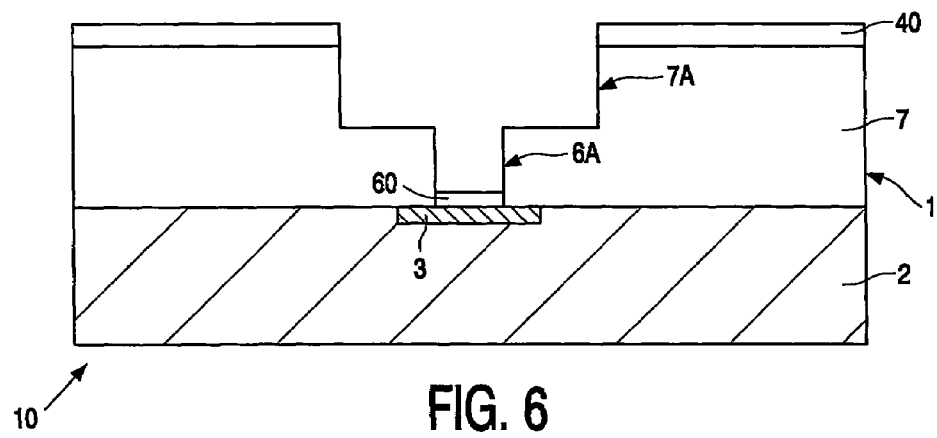
Figure 7:
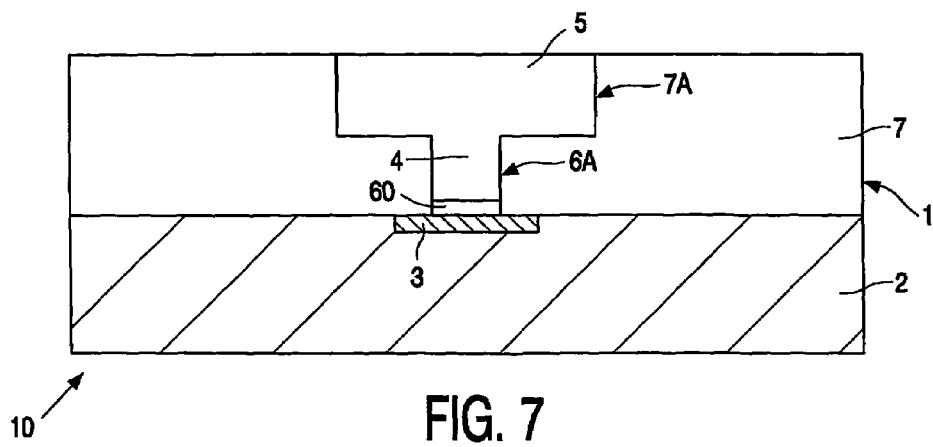

In the drawings:

FIGS. 1 through 7 are diagrammatic, cross-sectional views, at right angles to the thickness direction, of a semiconductor device in successive stages of the manufacture by means of an embodiment of a method in accordance with the invention.

The figures are not drawn to scale and some dimensions, such as dimensions in the thickness direction, are exaggerated for clarity. Corresponding regions or parts in the different Figures are indicated by means of the same reference numerals whenever possible.

FIGS. 1 through 7 are diagrammatic, cross-sectional views, at right angles to the thickness direction, of a semiconductor device in successive stages of the manufacture by means of an embodiment of a method in accordance with the invention. As a basis in the manufacture of the device 10 use is made (see FIG. 1) of a semiconductor body 1 with a substrate 2, here of silicon, wherein a semiconductor element 3, such as in this case a diode, is formed. It will be clear that the region referenced 3 may also be part of a transistor, such as the source or drain region thereof. Said region 3 may alternatively be a conductive region which is connected to a semiconductor region forming part of a diode or a transistor, or to a conductor track extending underneath the region 3. A 193 nm thick photoresist 66 is then spin-coated onto the semiconductor body 1, which photoresist is cured at a temperature in the range between 100 and 150 degrees Celsius. A mask 30 is then provided above the resist layer 66. In this case, said mask is a metal spot 30 provided on a glass plate, not shown.

Subsequently, (see FIG. 2) the resist layer 66 is exposed and developed, in which process the parts of the resist 66 situated outside the mask 30 are removed. The diameter of the dielectric region 6, which is round in this example, is 150 nm, and the height is 300 nm.

Next (see FIG. 3), a dielectric layer 7 is provided over the device 10, in this case by applying an SOG (=Spin On Glass) layer 7 to the surface by means of a centrifuging step. For the layer 7 a thickness is chosen that is preferably twice the thickness of the dielectric region 6, here a thickness of 600 nm.

Subsequently (see FIG. 4), the device 10 is heated in a furnace at a temperature of 400 degrees Celsius. In said process, on the one hand, the liquid SOG glass is converted to solid glass while, on the other hand, the dielectric region 6 decomposes and is gasified, causing a hollow space 6A to be formed in the dielectric layer 7 at the location where the dielectric region 6 was situated.

Next (see FIG. 5), a photoresist layer 40 is applied to the dielectric layer 7 and provided with the desired pattern by means of photolithography. The width of the strip-shaped aperture in the mask 40 is here chosen to be 200 nm. This is larger than the diameter of the hollow space 6A, which is 150 nm. This has the advantage that the trench 5 to be formed has a low resistance and can be aligned more readily with respect to the region 6.

Subsequently (see FIG. 6), a recess 7A is etched in the dielectric layer 7 by means of a dry/plasma etching process. The etch process is stopped as soon as the recess 7A is connected with the hollow space 6A in the dielectric layer 7. The device 10 is preferably cleaned then to remove any residue of the dielectric layer 6 from the hollow space 6A. For the cleaning operation use can be made, in this case, of an oxygen plasma.

Next (see FIG. 7), an electroconductive layer 60 is deposited on the bottom of the space 6A by means of sputtering. The material chosen for the layer 60 is TaN, which is not or at least substantially not permeable to copper. The thickness of the layer 60 is chosen to be 25 nm. Subsequently, both the space 6A and the recess 7A are filled with copper by means of an electroplating process. In this manner, a connection region 4 in the form of a so-termed via and a strip-shaped conductor 5 in the form of a so-termed trench are both formed so as to be recessed in the dielectric layer 7, the strip-shaped conductor 5 being electrically connected with the connection region 4.

The method can now be continued in a customary manner until the device 10 is completely finished. Customary process steps in said method are a CMP process and possible process steps in connection with the provision of further connection regions and conductors, which are recessed in a dielectric, followed by a CMP process. Next, for example, a layer of silicon nitride is provided wherein apertures are formed in which a connection metal such as aluminum is deposited. The steps mentioned in this paragraph are not shown in the drawing. Eventually, individual devices 10 can be obtained by means of a separation process such as sawing.

The invention is not limited to the example described hereinabove, since within the scope of the invention many variations and modifications are possible to those skilled in the art. For example, devices with a different geometry and/or different dimensions can be manufactured. Instead of a substrate of Si, use can be made of a substrate of glass, ceramic or a synthetic resin. The semiconductor body can then be formed by the so-termed SOI (=Silicon-On-Insulator). In this case, use can optionally be made of a so-termed substrate transfer technique.

It is further noted that if the above-mentioned SILK is used as the material for the dielectric layer, the desired recess in this material can also be formed by means of etching. A RIE (=Reactive Ion Etching) technique proved to be a suitable technique for this purpose. In this case, instead of using an oxygen plasma to perform said cleaning operation, it is preferable to carry out, for example, a so-termed argon sputtering process. If necessary, in particular the deposition temperature of the copper barrier can be chosen to be lower than the temperature used in the case of an SOG dielectric layer to preclude decomposition of the SILK material.

Furthermore, it is noted once more that the device may comprise further active and passive semiconductor elements or electronic components, such as a larger number of diodes and/or transistors and resistors and/or capacitors, whether or not in the form of an integrated circuit. The manufacture is of course efficiently adapted thereto.

The invention claimed is:

1. A method of manufacturing a semiconductor device with a semiconductor body, the semiconductor device including at least one semiconductor element that is equipped with at least one connection region connected to a superjacent strip-shaped connection conductor, the connection region and the superjacent strip-shaped connection conductor both being recessed in a dielectric layer, the method comprising:
   providing a first material in a dielectric region on the semiconductor body, the first material being made of an organic material and the first material having a decomposition temperature;
   coating the dielectric region with the dielectric layer, the dielectric layer being made of a second material having a decomposition temperature that is higher than the decomposition temperature of the first material;
   removing the first material by heating the semiconductor device to a temperature that is above the decomposition temperature of the first material yet below the decomposition temperature of the second material;
   after removing the first material, etching the dielectric layer to form a strip-shaped recess, that overlaps the dielectric region and extends to the dielectric region;
   forming the connection region by depositing an electroconductive material in a space obtained by the removal of the first material; and
   forming the superjacent strip-shaped connection conductor by depositing an electroconductive material in the strip-shaped recess.

2. A method as claimed in claim 1, characterized in that a photoresist is used as the first material, and
   a dielectric resin having a higher decomposition temperature than the photoresist is used as the second material.

3. A method as claimed in claim 2, characterized in that the first material is removed during a thermal treatment of the semiconductor body wherein the liquid glass is convened to solid glass.

4. A method as claimed in claim 1, characterized in that a photoresist is used as the first material, and a liquid glass is used as the second material, said liquid glass is convened to solid glass by heating.

5. A method as claimed in claim 1, characterized in that the first material as well as the second material are applied in liquid state to the semiconductor body with a centrifuging process.

6. A method as claimed in claim 1, characterized in that the dielectric region is formed by applying a further dielectric layer, covering part of the further dielectric layer with a mask, and removing the part of the further dielectric layer not covered by the mask by means of etching; and
   the dielectric layer is covered with a mask having an aperture at a location where the strip-shaned recess will be formed, after which the skrip-shaped recess is formed by means of etching.

7. A method as claimed in claim 1, characterized in that after removal of the first material and after formation of the strip-shaped recess, yet before deposition of the conductive material, the semiconductor body is cleaned.

8. A method as claimed in claim 1, characterized in that copper is used as the electroconductive material, and
   prior to deposition of the copper, an electroconductive layer is deposited, the connection region being formed on the electroconductive layer, said electroconductive layer forms a barrier for copper.

9. A method as claimed in claim 8, characterized in that the electroconductive layer is applied by means of a physical vapor deposition process, and
   the copper is provided by means of an electroplating process.

10. A semiconductor device obtained by the method of claim 1.

* * * * *